United States Patent
Fischer et al.

(10) Patent No.: US 6,238,590 B1
(45) Date of Patent: May 29, 2001

(54) TRIBOCHEMICAL POLISHING OF CERAMICS AND METALS

(75) Inventors: Traugott E. Fischer, Summit, NJ (US); Jianjun Wei, Lanzhou (CN); Sangrok Hah, Seoul (KR)

(73) Assignee: Trustees of Stevens Institute of Technology, Hoboken, NJ (US)

( * ) Notice: Subject to any disclaimer, the term of this patent is extended or adjusted under 35 U.S.C. 154(b) by 0 days.

(21) Appl. No.: 09/142,107
(22) PCT Filed: Mar. 3, 1997
(86) PCT No.: PCT/US97/04054
§ 371 Date: Dec. 14, 1998
§ 102(e) Date: Dec. 14, 1998
(87) PCT Pub. No.: WO97/33716
PCT Pub. Date: Sep. 18, 1997

Related U.S. Application Data

(60) Provisional application No. 60/013,323, filed on Mar. 13, 1996.

(51) Int. Cl.[7] .............................. H01L 21/302; C23F 1/00; B24B 1/00
(52) U.S. Cl. ............................... 216/88; 216/18; 216/19; 216/38; 216/99; 216/100; 216/108; 438/691; 438/692; 438/747; 438/754; 438/756; 438/757
(58) Field of Search .................................. 216/88, 90, 99, 216/100, 108, 18, 19, 38; 438/691, 692, 747, 754, 756, 757

(56) References Cited

U.S. PATENT DOCUMENTS

| | | | |
|---|---|---|---|
| 3,351,555 | * 11/1967 | Byers et al. | 252/79.2 |
| 3,549,439 | * 12/1970 | Kaveggia et al. | 216/88 |
| 4,994,139 | 2/1991 | Biermann et al. | 156/630 |
| 5,028,558 | 7/1991 | Haisma et al. | 437/62 |
| 5,073,461 | 12/1991 | DeKoven et al. | 428/698 |
| 5,284,803 | 2/1994 | Haisma et al. | 437/225 |
| 5,441,442 | * 8/1995 | Haisma et al. | 451/63 |
| 5,817,245 | * 10/1998 | Iwamoto et al. | 216/88 |

FOREIGN PATENT DOCUMENTS 4-336949 * 11/1992 (JP).

OTHER PUBLICATIONS

T. E. Fischer, "Tribochemistry", Ann. Rev. Mater. Sci. 1988, 18, 303–323.

* cited by examiner

Primary Examiner—Anita Alanko
(74) Attorney, Agent, or Firm—Licata & Tyrrell P.C.

(57) ABSTRACT

A method of polishing selected ceramics and metals is provided wherein the selected ceramic or metal material is rubbed against a solid surface in the presence of a nonabrasive liquid medium which only attacks the selected ceramic or metal material under friction. Examples of materials for the tribochemical polishing process includes ceramics such as silicon, silicon nitride, silicon carbide, silicon oxide, titanium carbide and aluminum nitride and metals such as tungsten. Both ceramic and metal surfaces can be polished, as in a damascene structure of an integrated circuit.

1 Claim, 1 Drawing Sheet

TRIBOCHEMICAL POLISHING OF CERAMICS AND METALS

This application is a 371 of PCT/US97/04054 filed Mar. 3, 1997, and also claim the benefit of Provisional No. 60/013,323 filed March 13, 1996.

INTRODUCTION

This invention was made in the course of research sponsored by the U.S. Government. Accordingly, the U.S. Government may have certain rights in this invention.

FIELD OF INVENTION

The present invention relates to a tribochemical process for the polishing of selected ceramics or metals. This method is an improvement on traditional processes of polishing these materials such as abrasive polishing, lapping, chemomechanical polishing or mechanochemical polishing.

BACKGROUND OF THE INVENTION

Tribochemistry is a branch of chemistry dealing with chemical and physicochemical changes of matter due to the influence of mechanical energy. The technological significance of tribochemistry applies to a number of different areas including formulation of lubricant additives, fretting wear of bolted junctions, mild wear of metals, the mechanical activation of reactions in processing industries, and the operation of seals in rotating machinery to technical leads for the possible development of novel lubricants. T. E. Fischer, *Ann. Rev. Mater. Sci.* 1988, 18, 303–323.

Tribochemistry has also been used in the production of an oxidized surface on ceramic or metal-ceramic materials. U.S. Pat. No. 5,073,461 (DeKoven et al.) describes a tribochemical process wherein a ceramic or ceramic-metal surface is oxidized by compressing it against an articulating ceramic or ceramic-metal surface with a sliding or rolling movement of one surface against the other under high vacuum. Oxygen or air, in an amount less than atmospheric pressure, is then introduced into the vacuum chamber while continuing the compressing of the surfaces by sliding or rolling of one surface against another.

Tribochemistry has also been used in conjunction with mechanical means for polishing of solid materials. For example, U.S. Pat. No. 4,994,139 (Biermann et al.) discloses a method of manufacturing a light-conducting device in which a layer of light conducting material is applied to a plane surface of a disc-shaped carrier body to form a light conductor body. In this process, mechanical grinding is used on the light conductor body to bring it to a thickness that exceeds the desired ultimate layer thickness by at least 50 micro-meters. The light conductor body is then subjected to alternative tribochemical and mechanical polishing until a thickness is obtained which exceeds the desired ultimate layer thickness of 10 micrometers. The light conductor body is then polished by a final tribochemical polishing until the desired layer thickness is obtained. Tribochemical polishing is carried out using $SiO_2$ grains having an average grain size of 30 nm in a NaOH solution having a pH value between 10 and 11.

U.S. Pat. No. 5,028,558 and U.S. Pat. No 5,284,803 (Haisma et al.) disclose similar methods for manufacturing semiconductors wherein the semiconductor body is mechanically ground to a first desired thickness, then alternately polished tribochemically and mechanically to a second desired thickness and finally polished tribochemically to the ultimately desired thickness. Tribochemical polishing is again carried out using $SiO_2$ grains having an average grain size of 30 nm in a NaOH or KOH solution having a pH value between 10 and 11.

It has now been found that tribochemical polishing can be used to smooth the surfaces of selected ceramics and metals without the use of abrasives such as $SiO_2$.

SUMMARY OF THE INVENTION

Figure 1:
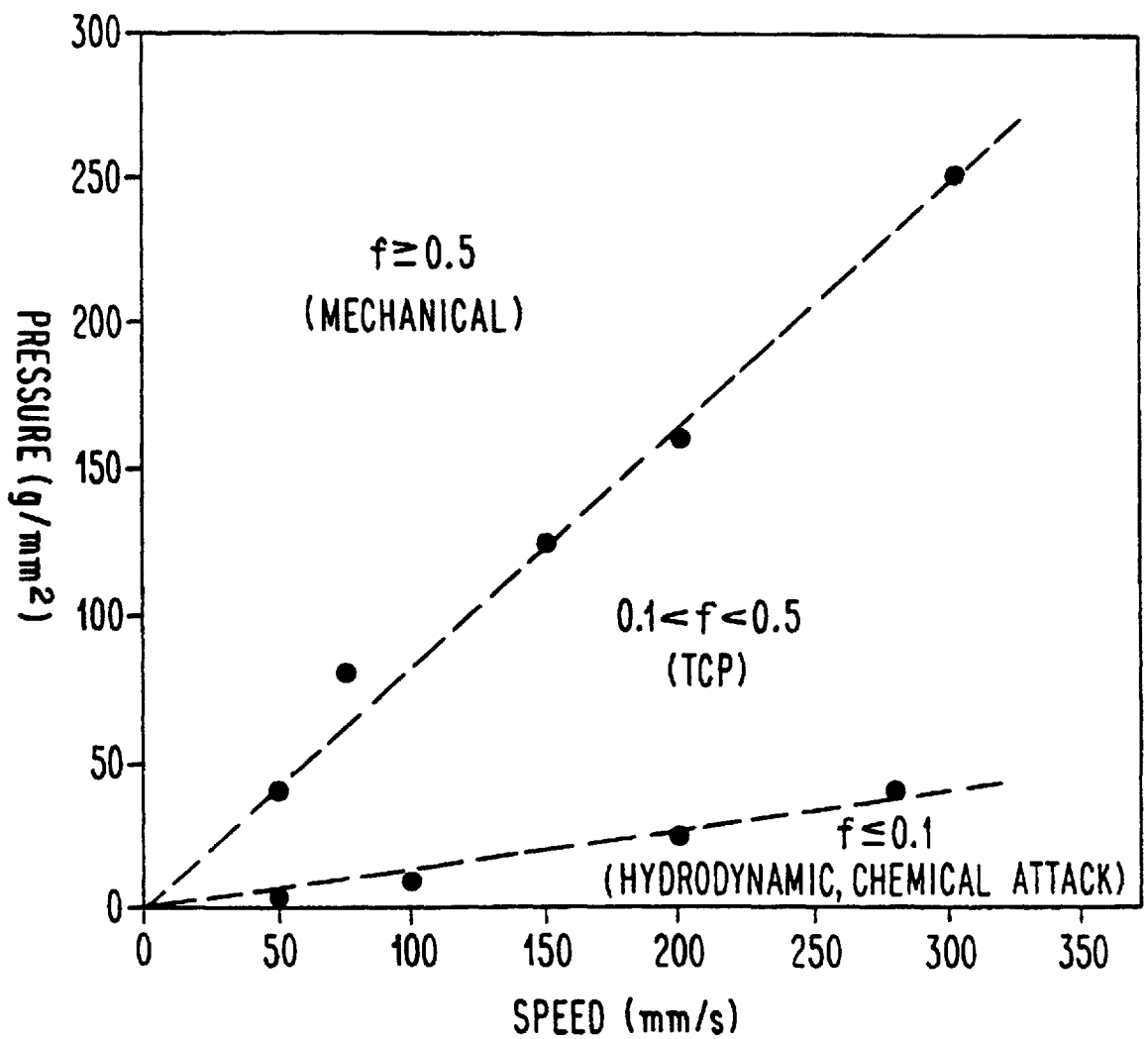
FIG. 1 shows a map of tribochemical polishing of tungsten as function of pressure and speed. A similar map was produced for tribochemical polishing of silicon nitride.

An object of the present invention is to provide a method of polishing selected ceramics or metals by rubbing the selected ceramic or metal material to be polished against a solid surface in the presence of a nonabrasive liquid medium which only attacks the selected ceramic or metal material under friction.

DETAILED DESCRIPTION OF THE INVENTION

The present invention provides a method for polishing selected ceramics and metals without the use of abrasives, abrasive slurries or other means of removing material by mechanical forces. This method differs from other technologies such as chemomechanical polishing or mechanochemical polishing which rely upon mechanical means such as abrasion, cutting, delamination, and adhesive wear to remove surface materials. Thus, the present invention provides a number of advantages over current technologies. First, the mechanical defects such as cracks that are inevitable in abrasive removal of brittle materials such as ceramics and which deteriorate the strength and fatigue of the material are avoided. Second, smoother surfaces are obtained since materials are removed only where the rubbing occurs, namely at protruding asperities. It has also been observed that the method of the present invention provides better planarity than chemomechanical and other techniques of polishing. Third, the polishing surface can be softer and may have a rougher surface than the material to be polished. The method of the present invention can be performed in the same polishing equipment as current technologies, or in equipment that is even simpler to use.

In the present invention, the material removal process is tribochemical, meaning that it is a chemical reaction that is activated by simultaneous friction. Implementation of the invention comprises rubbing the selected ceramic or metal material to be polished against a solid surface in the presence of a nonabrasive liquid medium which only attacks the material to be polished under friction. By "selected ceramic" it is meant to include any ceramic not in its most chemically stable state. Examples of ceramics which can be polished using the present method include, but are not limited to, silicon, silicon nitride, silicon carbide, silicon oxide, titanium carbide, aluminum nitride and all other ceramics not in the in their most chemically stable state. By "selected metal" it is meant to include any metal that does not form an outer oxide layer that is chemically and/or mechanically stronger than the metal itself. For example, tungsten is a metal which can be polished by the method of the present invention, while aluminum is not. Additional selected metals which can be polished by the method of the present invention will be obvious to those skilled in the art upon this disclosure. By "solid surface" it is meant a surface capable of creating sufficient friction when rubbing against the material to be polished. For example, for polishing of selected ceramics, solid surfaces comprising the same material as that being polished, cast iron and stainless steel have been implementated. However, any surface providing sufficient friction, including stiff rubber, can be used. For polishing of selected metals such as tungsten, the best results were obtained with a solid surface comprising $Si_3N_4$. By "nonabrasive liquid medium" it is meant any suitable fluid that is not reactive with the material to be polished or the solid surface except in the presence of friction between the material to be polished and the solid surface. Examples of appropriate nonabrasive liquid mediums include, but are not limited to, water, hydrogen peroxide, chromic acid or other liquid chromic compounds or a combination thereof. For polishing of tungsten, a 3% solution of $CrO_3$ was found to produce an optimal combination of polishing rate and surface quality. Combined solutions of $NaCr_2O_7+H_3PO_4$ and $CrO_3 +H_3PO_4$ are also effective for tribochemical polishing of tungsten.

The method of the present invention can be used in any polishing machine wherein the polishing tool is capable of creating sufficient friction when rubbing against the material to be polished. However, in the present invention, the abrasive slurry used in current methods is replaced with an appropriate nonabrasive liquid medium.

The method of the present invention is useful in the polishing and planarization of integrated circuits, the polishing and finishing of ceramic structural elements for which it is desired to achieve maximum strength or fatigue resistance and applications in which a very flat, smooth surface is required. The method of the present invention is also useful in the polishing of ceramic balls or rollers in rolling element bearings. In addition, the method of the present invention can be used as a replacement to chemical-mechanical polishing in the manufacture of silicon wafers and polishing of interconnect materials such as $SiO_2$ and metal layers; it is also useful in the polishing or planarization of surfaces that are comprised of ceramic and metallic areas.

Such surfaces are often referred to as "damascene" by those skilled in the art of integrated circuit technology.

The following nonlimiting examples are provided to further illustrate the present invention.

EXAMPLES

Example 1

Polishing Surface of Silicon Nitride

A stationary silicon nitride sample of one by two inches extension was pressed with a force of 100 Newton (approximately 10 kilograms or 22 pounds) against a cast iron rotating disk which formed the base of a cup containing distilled water so that contact between the sample and disk remained submerged. The silicon nitride sample was mounted in a manner that permits orientational freedom and glued to an aluminum back plate into which a conical hole was drilled. A stationary rod with a spherical extremity fitted into the conical hole in the plate and pressed it against the rotating disk by means of a weight. The rotating speed of the disk was 60 rpm. The polishing time depends on the roughness and planarity of the initial sample, however, for silicon nitride, approximately one micrometer of thickness is removed in 20 minutes under these conditions. Typically, a polished surface is obtained in less than two hours with a silicon nitride sample that was initially ground flat without special care.

Example 2

Comparison of Polishing Methods for Ceramics

The surface quality of silicon nitride that was tribochemically polished in 3 wt. % chromic acid was examined by Nomarski differential interference contrast optical, electron and atomic force microscopy. Surface residual stresses were measured by X-ray diffraction, and the fracture strength by the biaxial stress method.

The surface roughness measured by atomic force microscopy is Ra $\leq 0.5$ nm at 50 $\mu$M cut-off length, Ra $\leq 2$ nm at 150 $\mu$m. On a large scale, the surface roughness is Ra $\leq 4$ nm at 2.5 mm cut-off length and Ra $\leq 6$ nm at 8 mm; the Ra value at 8 mm is the measurement of a slight macroscopic curvature with a radius of 94 m and not of real roughness. The surface roughness (Ra) was compared with that of a silicon wafer polished by chemomechanical polishing in the semiconductor industry, of the highest quality, suitable for IC chip processing. The surface roughness of the latter is Ra $\leq 4$ nm and 6 nm over the cut-off lengths of 0.8 and 2.5 mm. In the cut-off length of 8 mm, it is Ra $\leq 10$ nm.

Tribochemical polishing of silicon nitride not only produces a very low roughness, but also stress-free surfaces. Surface residual stress measurements by X-ray diffraction indicate the presence of compressive stress of 50 Mpa. No degradation of the fracture strength is found. The average fracture strength measured by the biaxial stress method is about 770 Mpa.

Example 3

Polishing tungsten

A tungsten bar having a diameter of 3.175 mm was polished. Purity of this bar was 99.9% wt. Two types of surfaces were made for polishing, the first being a sphere with a radius of 2.8 mm, the second being a plane. The polishing tool was $Si_3N_4$, (Ra=0.05$\mu$m). The polishing solution was 3% $CrO_3$.

Tribochemical polishing tests were performed using a pin-on-disc tribometer. Static etching tests were also conducted in some solutions. All tests were run at room temperature. Optical Nomarski interference microscopy, Scanning electron microscopy (SEM) and Atomic force microscopy (AFM) were used to observe the polished surfaces. The surface roughness was measured by a profilometer and AFM.

For spherical samples and $Si_3N_4$, the optimal load was 4–20 grams and the optimal speed was 30–100 mm/second for a test time of 30 minutes.

A series of chemical solutions were used under these conditions to tribochemically polish the spherical tungsten samples. For most selected solutions, the polished surfaces underwent mild or severe chemical attack and thus became rough. However, a few solutions, including $H_2O$, $CrO_3$, $CrO+1$ $H_3PO_4$, $H_3PO_4+Na_2CrO_7$ exhibited promising polishing results. In $H_2O$, the surface contained some small parallel scratches. The combined solution of $H_3PO_4$ and $Na_2Cr_2O_7$ produces a smooth surface, but uneven reaction films with white colors were formed on the surface. The polished surface in $CrO_3$ solution was very smooth, with only occasional scratches forming due to the presence of impurities.

The material removal rate (MRR) or polishing rate of tungsten against silicon nitride in these solutions was also compared. Tests were run at a load of 10 grams, a speed of 100 mm/second and a test time of 30 minutes. MRR in dry sliding was $5.4 \times 10^{-6}$ mm$^3$/N.m. MRR in water was $2.3 \times 10^{-6}$ mm$^3$/N.m. MRR in 3% CrO$_3$ solution was $1.6 \times 10^{-5}$ mm$^3$/N.m. This high removal rate in oxidant solutions is indicative of the tribochemical reaction between the tungsten and the oxidant. However, the CrO$_3$ solution produces the best combination of polishing rate and surface quality.

Tribochemical polishing of a tungsten plane against a Si$_3$N$_4$, plane in CrO$_3$ solution was also examined. For the plane sample and Si$_3$N$_4$ tool, the optimal pressure was 2–300 grams/mm$^2$ and the optimal speed was 10–400 mm/second.

The effect of speed on the friction coefficient of tungsten versus Si$_3$N$_4$ was determined in experiments wherein the pressure was fixed at 50 grams/mm$^2$. As the speed was increased from 50 mm/second to 400 mm/second, the friction coefficient decreased from 0.72 to 0.07. This corresponds to the change of lubrication state from boundary to mixed, and finally, to hydrodynamic lubrication. The surface quality was also examined at different speeds. It was found that when the speed was lower than 70 mm/seconds, i.e., friction (f) >0.5, many scratches were found on the polished surfaces and sometimes noise was produced thus demonstrating that mechanical wear dominates the material removal process. When the speed is increased to more than 300 mm/second, i.e., f<0.1, the polishing rate is very low and the tungsten surface becomes a little rough because of light chemical etching. However, when the speed is in the range of 70 to 250 mm/second, i.e., 0.1<f<0.5, the surface is smooth as tribochemical polishing occurs within this range.

A series of polishing tests in a wide range of pressure and speed were conducted to obtain a map or tribochemical polishing of tungsten as depicted in FIG. 1. Friction coefficient values of 0.1 and 0.5 were used as boundary conditions to distinguish different regions. Two boundary lines or three regions were obtained in the map. Along the boundary lines, the pressure increases linearly with increasing speed. The upper line separates mechanical from tribochemical phenomena. For a given speed, when the pressure is higher than a critical value, i.e., the friction coefficient is 0.5, mechanical wear dominates the material removal process and the surface is rough; when the pressure is decreased below the critical value, tribochemical polishing occurs. The lower line separates the mixed and hydrodynamic lubrication regimes. When the pressure is lower than a critical value, i.e., the friction coefficient is 0.1, hydrodynamic etching occurs. At this friction coefficient, there is no more contact at asperities increasing the reaction rate. Thus, the corrosion is general, resulting in a rough surface. Tribochemical polishing of tungsten occurs in the range of pressure and speed depicted in the middle range of the map of FIG. 1 wherein f is between 0.1 and 0.5. Thus, the map provides guidelines to one of skill in the art to select appropriate operating conditions for polishing of metals such a tungsten. Additional factors which affect the location of these boundary lines of the map include, but are not limited to, roughness of the metal surface to be polished and the polishing tool, the mechanical properties of the tools, temperature, chemicals and contamination of the environment.

What is claimed is:

1. A method of polishing a selected material comprising rubbing a selected material to be polished against a solid surface in the presence of a nonabrasive liquid medium which only attacks the selected material under friction where the material to be polished comprises a combination of ceramic and metallic areas.

\* \* \* \* \*

UNITED STATES PATENT AND TRADEMARK OFFICE
CERTIFICATE OF CORRECTION

PATENT NO. : 6,238,590 B1
DATED : May 29, 2001
INVENTOR(S) : Fischer et al.

It is certified that error appears in the above-identified patent and that said Letters Patent is hereby corrected as shown below:

Column 2,
Line 59, please delete "the in".

Column 4,
Line 57, Example 3, please delete "CrO+1 $H_3PO_4$" and insert -- $CrO_3 + H_3PO_4$ --.

Signed and Sealed this

Thirteenth Day of May, 2003

JAMES E. ROGAN
*Director of the United States Patent and Trademark Office*